United States Patent [19]
Flamholz et al.

[11] Patent Number: 5,235,626
[45] Date of Patent: Aug. 10, 1993

[54] SEGMENTED MASK AND EXPOSURE SYSTEM FOR X-RAY LITHOGRAPHY

[75] Inventors: Alexander L. Flamholz, Monsey; Robert P. Rippstein, Hopewell Junction; Yuli Vladimirsky, Chappaqua; Chester A. Wasik, Poughkeepsie, all of N.Y.

[73] Assignee: International Business Machines Corporation, Armonk, N.Y.

[21] Appl. No.: 781,562

[22] Filed: Oct. 22, 1991

[51] Int. Cl.$^5$ .............................. G21K 5/00
[52] U.S. Cl. ......................... 378/34; 378/35; 378/205; 250/491.1; 250/492.2
[58] Field of Search ............ 378/34, 35, 208, 205; 250/491.1, 492.2, 443.1

[56] References Cited

U.S. PATENT DOCUMENTS

| | | | |
|---|---|---|---|
| 4,260,670 | 4/1981 | Burns | 430/5 |
| 4,451,544 | 5/1984 | Kawabuchi | 378/35 |
| 4,791,302 | 12/1988 | Nozue | 250/491.1 |
| 4,823,012 | 4/1989 | Kosugi | 250/492.2 |
| 4,825,086 | 4/1989 | Mueller | 250/491.1 |
| 4,856,037 | 8/1989 | Mueller et al. | 378/34 |
| 4,861,162 | 8/1989 | Ina | 356/401 |
| 4,939,052 | 7/1990 | Nakagawa | 378/35 |
| 5,036,209 | 7/1991 | Kataoka et al. | 250/492.2 |

Primary Examiner—David P. Porta
Assistant Examiner—Kim-Kwok Chu
Attorney, Agent, or Firm—Graham S. Jones, II

[57] ABSTRACT

An x-ray lithography mask design provides for replacement of a single large area membrane with a set of smaller membranes (segments) fabricated on a single mask substrate forming a segmented mask. The segments are arranged serially so that they can be sequentially aligned and exposed by a shaped x-ray beam. Thus, the segmented mask is a series of mask membrane segments mounted together.

7 Claims, 2 Drawing Sheets

SEGMENTED MASK AND EXPOSURE SYSTEM FOR X-RAY LITHOGRAPHY

BACKGROUND OF THE INVENTION

1. Field of the Invention

This invention relates to x-ray lithography and more particularly to exposure of lithographic masks with x-ray radiation.

More particularly, it relates to use of the x-ray lithography masks to expose semiconductor circuit patterns through said masks.

2. Description of Related Art

In photolithography, light beams are employed to write upon photosensitive materials. Where masks are used, the writing light beam exposes patterns on photosensitive polymeric materials known as photoresist through patterned masks. The patterned masks comprise transparent and opaque regions for transmission of light through the mask or blocking of light. After exposure to the light, the exposed photoresist can be developed to reveal the exposed patterns. In industry today, one of the most important applications of such processes of exposing patterns onto photoresist is the manufacture of integrated semiconductor circuits. Such semiconductor circuits are being made smaller and smaller as the technology progresses. It has been the convention in industry in the recent past to use light in the visible range to expose semiconductor circuit patterns. However, the light wavelength should be about one half of pattern feature sizes to achieve adequate definition of image line width control. Accordingly, shorter wavelengths of light are being employed and now one trend is towards the use of x-rays to expose the resist with patterns for such small integrated circuits. X-ray radiation is employed to expose the photoresist through an x-ray mask. The type of radiation contemplated for a preferred embodiment of this invention is synchrotron x-ray radiation. The application of this invention is not limited to use with synchrotron x-ray radiation, however.

Synchrotron x-ray radiation is produced as a broad, fanned out horizontal beam which is narrow in the vertical direction. X-ray lithography systems are designed to take advantage of this form of fanned out radiation by passing relatively large horizontal angles (e.g. 25 mrad) through a high vacuum BL (beamline) and transmission window, and scanning the beam fan in the vertical direction. Large angle BL optics, and BL windows and x-ray masks with large dimensions are required to cover large fields in this fashion.

Synchrotron based x-ray lithography has the potential for forming microelectronic products by exposing images onto large fields of photoresist or the like at high speeds with concurrent high resolution. Realization of this potential, in practice, requires the ability to produce high resolution masks covering large fields with high positional accuracy.

In the manufacture of state of the art electronic chips by the technology of the exposure of photoresist with x-rays there is a basic problem below the half micron dimension, in that there is a conflict between the overlay requirement on the one hand and use of large field exposures, which large field exposures are conventionally thought to be the way to achieve high throughput on the other hand. There is a need to compromise between those two conflicting objectives, with accuracy but without sacrificing the speed of manufacture.

For example, a typical large field, large chip application would involve covering a 10 sq. cm field of five, 10 by 20 mm chips using a 50 mm horizontal BL aperture (and window) and would require an x-ray mask 50 mm wide and 20 mm high. In order to fabricate a large area mask of this large size from a membrane with sufficient mechanical stability to avoid being warped or bent requires that the membrane be sufficiently thick to avoid such distortion. In addition, in order to align and expose a single large field with high overlay requires that the needed positional accuracy of the mask be maintained over the entire large field.

If such large area masks could be made with adequate accuracy, stability and transmission of x-rays, they would also need to be fabricated at practical yields and throughput with very low defect levels. These combined requirements on large field masks are formidable and such masks may not be available in practice for a long time, if ever.

Steppers project a series of images from a single mask onto the wafer from a fixed location, with the mask separated, i.e. moved away from the wafer and returned into proximity with the wafer at a different position for each exposure. With a stepper, repeated exposures are made from the mask onto the wafer to fill the wafer with exposed images. When exposure of images is completed, then the wafer can be indexed to another position relative to the mask and the mask and wafer can be reexposed until the exposure is complete for the areas which were not exposed the first time.

There is a requirement for positional accuracy over an entire large field, but it is not possible, to achieve such standards at this time. Compounding the problem is the fact that future lithographic ground rule improvements, i.e. requiring a greater degree of miniaturization, will exacerbate the problem. Thick membranes are undesirable in that they reduce the quantity of energy transmitted through the membrane as a function of the thickness of the membrane. In addition, as the speed with which exposure is achieved is important, a commercially feasible method of achieving accuracy of exposure must perform with adequate speed for efficient production of chips.

RELATED ART

U.S. Pat. No. 4,260,670 of Burns for "X-ray Mask" shows an x-ray mask having a plurality of apertures in a modified checkerboard pattern, containing a plurality of segments of an x-ray mask. A wafer coated with photoresist is exposed to x-rays through all the x-ray mask segments simultaneously. Following that exposure through all segments of the mask, the mask and the substrate are indexed one aperture position ahead or to one side, relative to the x-ray beam. Then the remaining unexposed portions of the photoresist coating are exposed by x-ray beam exposure through the same mask segments at adjacent positions on the wafer, so that the entire wafer is exposed in a pair of exposures.

U.S. Pat. No. 4,861,162 of Ins et al for "Alignment of an Object" describes the method for positioning a semiconductor wafer on a chuck onto which "regions of an image" are to be "transferred at a transfer station," in devices such as semiconductor wafer steppers, which are step-and-repeat type reduction projection exposure equipment. No concept of forming of a composite image of a chip from a number of small segments is suggested.

SUMMARY OF THE INVENTION

In accordance with this invention, a new mask design concept and means for its efficient utilization are provided. A single large area membrane is replaced with a set of smaller membranes fabricated on a single mask substrate forming a composite mask. The segments are arranged serially so that they can be sequentially exposed within a shaped x-ray beam. The composite mask looks like a series of mask membrane segments mounted in a long tape. It is also analogous in configuration to a motion picture film (without the sprocket holes) in which the images on the mask segments can be the same or different.

Further in accordance with this invention, associated alignment and exposure procedures are also included which provide the stability and accuracy associated with small alignment fields while maintaining the high throughput advantages of large exposure fields.

Still further in accordance with this invention, the scanning system takes advantage of the large total pattern area on the single mask substrate. The resultant system has higher total throughput and placement accuracy than would be possible using single (large) mask fields.

TRANSMISSION IMPROVEMENT

Advantages:
higher optical and x-ray transmission which
  allows faster exposure time
  faster alignment
  more accurate alignment (better alignment signal)
  easier mask fabrication by having sufficient optical transparency to eliminate the need for external alignment windows composed of optically more transparent materials than used for the actual pattern area.
    Note: Since optical alignment through an x-ray mask uses an optical signal which travels through the membrane twice, any improvement in membrane transmission has a compound effect.
Higher overlay accuracy resulting from fabricating and aligning smaller fields
Comparable or improved mask stability (when smaller membrane fields are utilized)
Advantages of multiple segments (and multiple alignment sites)
  Produces a large effective pattern area while maintaining high overlay accuracy.
  Facilitates using single segment master reticle from which multi-segment "working masks" can be made. This single segment/working mask concept can lead to the advantages, as follows:
    1. Improved overlay resulting from the fact that smaller fields are used and that each field is a copy of the same master.
    2. Greater mask yield since pattern writing errors need only be detected and repaired for the single smaller field "master". (Process induced error incidence does not necessarily change)
    3. With fewer, smaller fields to write there is a better opportunity for the pattern generator to write multiple masks with tight mask-to-mask overlay.

DESCRIPTION OF THE PREFERRED EMBODIMENTS

Process of Using the Plural Segments

Figure 1:
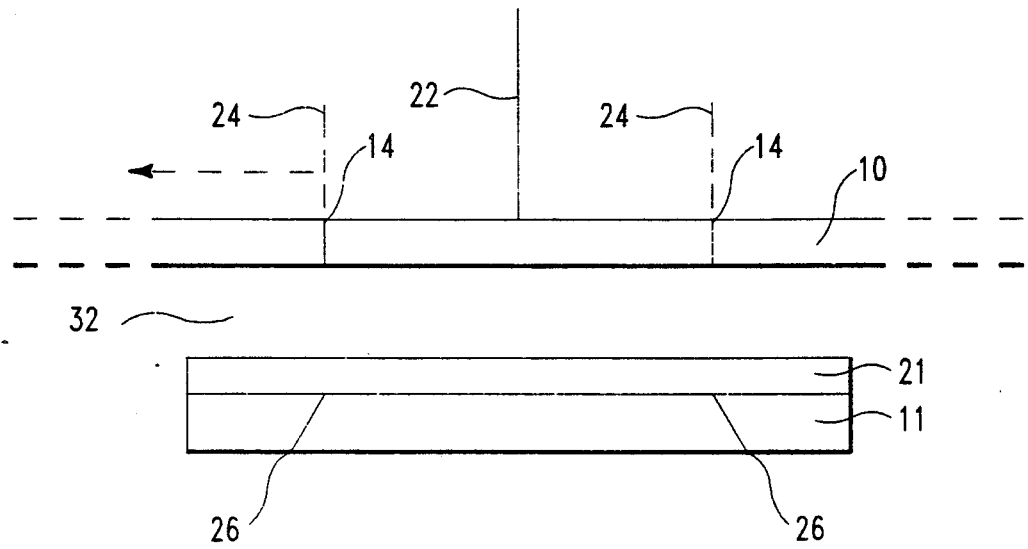
FIG. 1 shows an x-ray beam, a mask in accordance with this invention and a semiconductor wafer coated with photoresist being exposed to the x-ray beam through the mask.

A preferred embodiment of apparatus for synchrotron radiation is described as follows:

FIG. 1 shows a proximity exposure system using an x-ray beam 22 directed upon a segment 16 of a composite mask 10 in accordance with this invention. The mask contains alignment marks 14 and the wafer 11 beneath, coated with resist 21, contains a set of alignment marks 26. Alignment beams 24 are aimed towards the marks 14 and 26 for alignment, as is well understood in the art.

Figure 2:
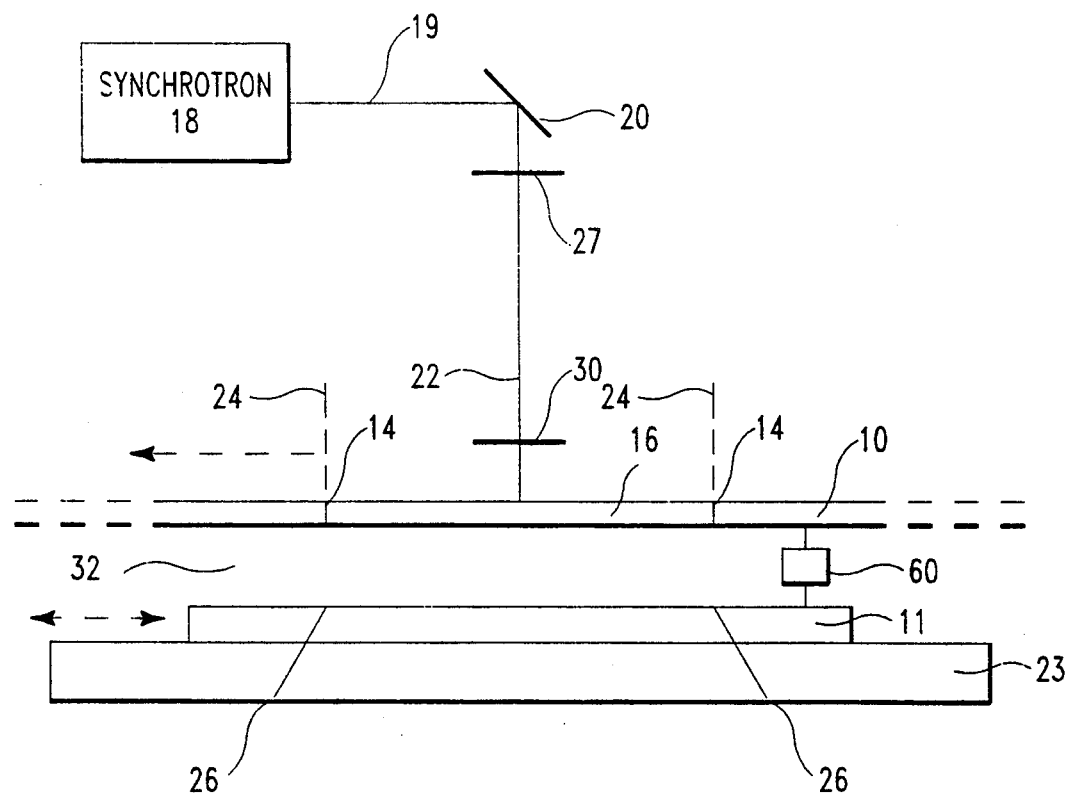
FIG. 2 shows an align and expose system which utilizes the mask of FIG. 1 in a scanning mode.

FIG. 2 shows the system of FIG. 1 with a synchrotron 18 generating the x-ray beam 22 via beamline 19 and mirror 20. Beneath the wafer 11 is a wafer holder 23. The x-ray beam of FIG. 2 can move or remain fixed in position In one case the wafer 11 and the mask 10 move together, so what is done is that the mask 10 and the wafer 11 are joined together while a fixed gap is maintained between them for a predetermined interval of time and they are physically moved together to be scanned together under the curved slit of light emitted by the x-ray source (BL) 19, until the mask 10 and the wafer 11 pass beyond the x-ray beam 22. Then the system retraces the exposure to scan the x-ray beam 22 across the mask 10 and the wafer 11 in the opposite direction. In that context, exposure is performed as follows:

1. Align the above-described mask 10 with respect to the wafer 11, as is well known to those skilled in the art. Scan the above mask and wafer pair jointly with respect to the beam 22 without shifting the mask and wafer relative to each other when the beam 22 passes beyond the mask opening it can accelerate to the next segment, as is taught in U.S. Pat. No. 4,856,037 of Mueller.

2. Collect information on location of mask 10 and wafer 11 at next site while current site is being exposed, so alignment correction information for next site is obtained in parallel with exposure of the current site. This is done by sensing alignment marks 14 on the mask, located close to the site of the next expose wafer and mask segments, which "telegraph", i.e foretell the approach of a new segment in the mask at any time prior to the exposure thereof.

3. Close shutter 27, while the mask and wafer continue to index to the next site.

4. Execute the alignment of the mask 10 and the wafer 11 with respect to each other and perform sensing of the gap 32 between them while the exposed location moves away from under the x-ray beam 22 and the next site is moving towards the beam 22 for exposure of the next site.

5. Monitor and reset gap 32 between exposures, if required, by means of a sensor 60 schematically shown between mask 10 and wafer 11.
6. Interleave areas to cover unexposed areas of the vertical scan.
7. To cover the entire wafer 11 horizontally, two vertical scans whose lengths are each equal to the full length of the vertical dimension of the patterned mask area are made seriatim, as follows:
   a) the wafer 11 is stepped horizontally by a distance equal to the horizontal dimension of the exposure segment, and
   b) the vertical scan process is repeated.

In another aspect of the invention, different patterns can be exposed in different segments.

Herein we describe a method for fabricating x-ray membrane masks 10. This method maintains the throughput advantages of large fields, but uses small field membrane segments 16 which are much easier to build and to replicate. In addition, by securing a multiplicity of these small membrane segments to a single x-ray mask substrate 12, a large area can be made available for x-ray exposure posture.

MASK AND SYSTEM CONCEPT

Figure 3:
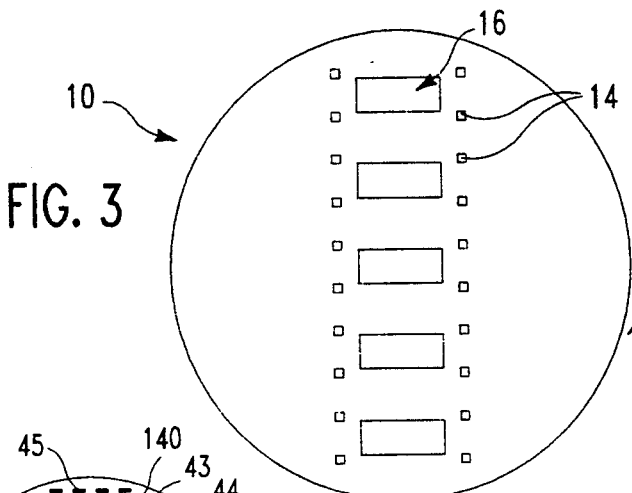
FIG. 3 shows a segmented mask apparatus in accordance with this invention.

To accomplish these objectives we replace the single, large area membrane with a set of small membranes 16 of FIG. 3 arranged on a mask substrate 12 in accordance with this invention. Because the area of each of the small membranes 16 is less than required of a monolithic large membrane, membranes 16 can be thinner while maintaining strength and stability equal to or better than that of a conventional larger, thicker, single membrane mask. Thinner masks are significantly more transparent, giving a shorter exposure time for a given area at a given x-ray energy level. About a 50% transmission improvement is achieved with small, thin masks.

PROCESS STEPS

The preferred process is as follows:

1) An x-ray mask 10 containing a multiplicity of thin, small membrane segments 16, fabricated on a single mask substrate 12 as shown in FIG. 3, is used to provide higher overlay accuracy and stability and higher x-ray and optical transmission than the single larger (and thicker) mask membrane areas currently used.

2) Membrane segments 16 are arranged on the mask substrate 12 parallel to each other, so that they can be scanned sequentially in a direction perpendicular to the beam fan by or through the narrow x-ray beam.

3) An align and expose system shown in FIG. 2 utilizes the above described mask in a scanning mode which minimizes system overhead time (time not spent exposing) by taking advantage of the higher transmission described in (1) and the suitably arranged multiple segments described in (2).

THE SEGMENTED MASK

Mask Design:
FIG. 3. shows an example of a composite mask 10 designed in accordance with this invention. The mask 10 contains a multiplicity of segments 16 separated by areas of thick mask substrate 12.

The membrane area is specifically thinner than would be needed if the same total area were covered with a single membrane segment 16.

Alignment marks 14 are printed for each field segment (or even every sub-field segment) Alignment marks 14 which are both internal and external to the exposure field membrane segments 16 are possible.

The segments 16 are arranged so as to facilitate scanning of all the mask fields through or by an x-ray beam.

MEMBRANE THICKNESS AND TRANSMISSION

We have replaced large field membranes with several membranes 16 of smaller size and regained exposure speed by using thinner membranes. The effects of using smaller thinner membranes and the fact that transmission improvements greater than a factor of two can be achieved are discussed next.

ANALYSIS

For a rectangular membrane of thickness h, and small dimension a, it can be shown (see S. Timoshenko and S. Woinowsky-Krieger, Theory of Plates and Shells, McGraw Hill, New York (1959)) that the deflection resulting from a distributed load (e.g. pressure or thermal) is proportional to $$h^3/(a)^4$$

and depends only on the smaller dimension when the aspect ratio is 2:1 or greater.

If we use the inverse of the deflection as a measure of strength then the strength is proportional to $$(a)^4/h^3.$$

(For large deflections this dependence on thickness h is even stronger.)

FIELD SIZE COMPARISONS

To estimate the impact of reducing membrane size and thickness, we compare the 10×20 mm small field using the segmented mask with the 20×50 mm large field using a mirror scan while the strength is kept constant.

Note: Since only the smaller dimension affects the relative strength for these rectangles, the 2:1 reduction in $a$ is the key factor in the comparison. If the membrane strength is kept constant then
h is proportional to $(\underline{a})^{4/3}$.

MASK THICKNESS

For the mask, a is reduced by a factor of 2, so that h is reduced to $0.4 \times \bar{h}$ (i.e. thickness h of a small membrane is 40% of the required thickness for a large monolithic membrane) as a result of the 4/3 power relationship. Since the transmission is proportional to $$\exp(-a\,h)$$

where "$a$" is the absorption constant of the membrane 16 in FIG. 3, then if h changes to $0.4 \times h$ the transmission will become New Transmission = Original Transmission × 1.5

WINDOW THICKNESS

For the mirror scanner the BL 19 has a window which must cover the full mask field so that a=20 mm, where (in this case) a is the exposure field dimension in the scan direction, for the BL window with the mirror scanner 20. When the mask 10 and wafer 11 are scanned through the beam 22, however, the BL window 30 need only be as large as the x-ray beam. Using a conservative value of 5 mm for the beam size we have a=5 mm for the BL window 30 in the segmented mask system. Thus, using the segmented mask scanner can give a 4:1 decrease in the size of the window 30, which based on the above analysis results in a 1.8× increase in transmission of x-ray energy. Combining the two transmission factors gives a total improvement in transmission of 2.7× while maintaining constant strength, when the segmented mask scanner is used.

ALIGNMENT AND EXPOSURE SYSTEM FOR SEGMENTED MASK

The segmented mask concept and its advantages are described above. Below is a description of a means for aligning and exposing the segmented mask over a large wafer. The method provides high throughput while maintaining the advantages of aligning and exposing small fields.

DESCRIPTION

In this section the key components of the alignment and exposure system are described.

MASK

The composite mask 10 is built with multiple segments 16 as shown in FIG. 3. Each segment 16 includes its own alignment marks 14 within or adjacent to the membrane field.

EXPOSURE

The exposure system is designed to
align each segment 16 of the mask 10 with respect to the wafer
set the gap 32 between the mask 10 and the wafer, and
scan the mask and wafer by or through the beam.

To take advantage of the "large area" mask created by the use of multiple segments 16, the mask 10 is located with respect to the wafer prior to scanning so that all the segments 16 are positioned close to their desired locations on the wafer by an initial coarse alignment operation. Alignment and exposure can then proceed by scanning the mask/wafer pair by the beam, or through the beam, with a small fine alignment correction for each segment as shown in FIG. 4, which is described next.

MASK/WAFER PAIR SCANNING

Figure 4A:
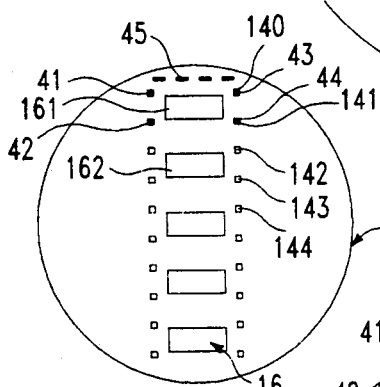
FIGS. 4A-4F show a sequence of positions of a mask in accordance with FIG. 3 as it translates relative to a substrate being exposed through the mask.

Though it is possible to scan either the beam or the composite mask 10 and wafer with respect to the beam, below, a system using the latter method is described. To expose the wafer, it is aligned with respect to the mask 10 at "align site 1" as shown in FIG. 4A with the alignment beams 41, 42, 43 and 44 (such as optical beams) directly illuminating the four alignment marks 14 proximate to or within the particular mask segment 16 to be exposed, which is the top segment in FIGS. 4A and 4B. As the mask 10 and wafer 11 are in position to be exposed, the mask 10 and wafer 11 pair is scanned jointly with respect to the x-ray beam 45 as shown by the dotted lines 45 in FIGS. 4A–4F where the mask and wafer are moving from bottom to top under the beam 45 and the alignment beams 41–44 which are affixed to the support for the x-ray beam 45. It can be seen that the alignment beams 41, 42, 43 and 44 which are fixed in position are moving down relative to the alignment marks 14 on the mask substrate 12. Note that the alignment marks 14 on the right side of the drawings are numbered from 140 to 144 and there are no additional numbers on the left side for convenience of illustration. In FIG. 4A, the alignment beams 41–44 are directed at the alignment marks 14 (beams 43 and 44 hit the marks 140 and 141) which surround the uppermost segment 161 of segments 16, with beam 45 just above segment 161. Thus the scan is almost ready to begin to expose the wafer 12 to the first segment 161, as shown in FIG. 4B when the mask/wafer pair 12/11 move upwardly and beam 45 is hitting the top of segment 161, but the top alignment beams 41 and 43 are now below the level of alignment mark 140 and above the level of alignment mark 141.

Figure 4C:
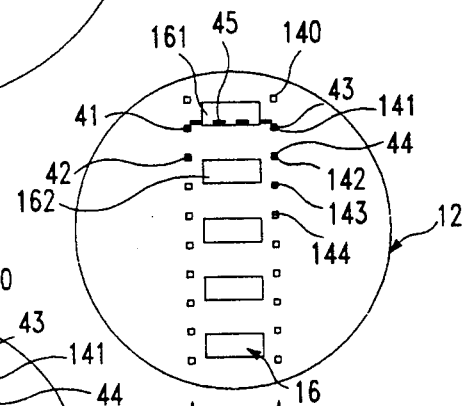
Figure 4B:
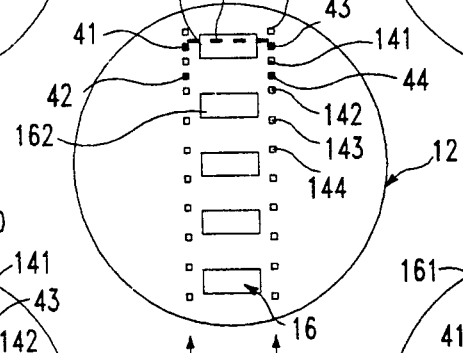

As the mask/wafer pair is scanned through "expose site 1" by the beam 45 in FIG. 4B, the region of the next mask and wafer segments to be aligned and exposed enter the field of view of the alignment optics in FIG. 4C, which shows "align site 2" with the beam 45 at the bottom of the top segment 161 and above the next mask segment 162 whose position needs to be determined in advance of its exposure, in accordance with this invention.

Figure 4D:
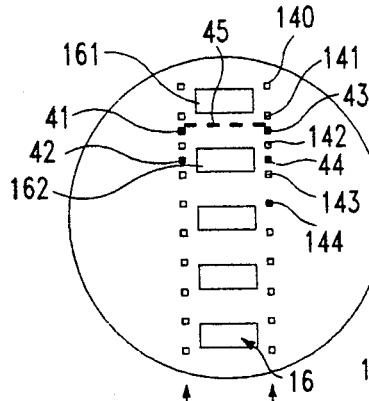
Figure 4F:
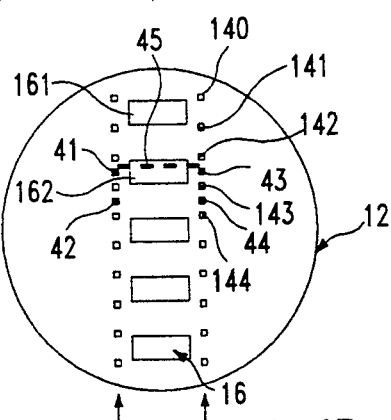

In FIG. 4C, the beam 45 is nearing the bottom of segment 161 and the alignment beams 41–44 are hitting the four alignment marks 14 at the level of marks 141 and 142 giving the system data as to the location of the top of segment 162 which is the next segment 16 to be scanned by the beam 45 when the segment rises even higher as is shown in FIG. 4F, which is the last drawing in the series.

At this point, information on the relative location of the composite mask 10 and wafer 11 at the next site is obtained while the current site is being exposed as indicated by dotted line 45 in FIG. 4B which shows the x-ray beam targeting the mask segment 162 below it. In this way most of the alignment correction information needed to position the mask 10 and wafer 11 properly at the next site 162 is obtained in parallel to exposure of the current site 161. This parallel acquisition serves to reduce the alignment time for each segment contributing to higher throughput. Once the mask/wafer pair has cleared the beam 45, exposure is complete, the shutter 30 can be closed, and the final alignment operations for the next site can take place.

FIG. 4D shows the beam 45 just below the first segment 161 with the alignment beams between the level of alignment marks 141 and 142 and between marks 142 and 143 respectively.

Figure 4E:
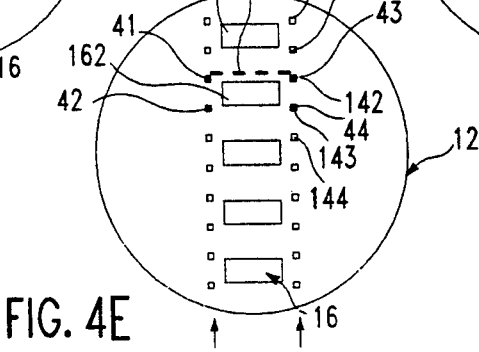

FIG. 4E shows the beam 45 just above the second segment 162 and the alignment beams 41–44 on target on the marks just one segment lower than in FIG. 4A, which is "expose site 2".

Then exposure can be made at the next site, which is shown in FIG. 4F, which is one segment lower than FIG. 4B. No further figures are shown, as it is believed to be obvious at this point how the process continues.

Depending on scan speed (which affects exposure time), spacing between segments, and alignment time the scan across the solid area between segments can take place as follows:
 uniformly
 with slow down and speed up back to the required scan velocity for exposure
 with a stop for alignment acquisition and restart of scan.

If alignment acquisition and correction time can be kept small, scanning can be kept uniform across the solid areas. Short alignment time between segments can result from some or all of the following:

1. When the first site is aligned, the mask 10 and wafer are already closely aligned across the full area. Since no shifts or steps are needed in moving to the next site, they will be very close at the next site as well.
2. The mask 10 is fixed and can be pre-measured so that mask alignment mark locations from segment to segment can be known accurately and predicted.
3. Relative location information for the next site has been acquired and processed in parallel with exposure of the previous site.
4. Use of global alignment methods where the wafer and mask 10 are mapped at a selected (reduced) number of sites prior to exposure.
5. Thin, and therefore, high transmission alignment mark areas provide high signal to noise alignment information.

GAP SETTING

Proper exposure of half micron and smaller images using an x-ray proximity exposure system requires that the gap 32 between the mask 10 and the wafer 11 be set at values from as much as 50 μm down to as little as 10 μm with a tolerance approaching 0.5 μm. With the conventional step-and-repeat approach the gap 32 must be set, possibly separated and reset for every exposed field. Doing this at high speed with high precision is quite difficult and can lead to flow and compression problems involving the gas within the gap. With the segmented mask scanner the mask 10 and wafer are set to the nominal proximity gap 32 once for each large scan field. During the "dead time" between fields the gap 32 can be monitored and readjusted if necessary. Since the mask 10 and wafer 11 are never separated between exposures, this field to field gap 32 adjustment will be small, enabling high speed, high precision adjustment and eliminating any gas flow problems.

Furthermore, since any necessary adjustments of gap 32 are done at the same time with the alignment and scan between segments, gap 32 adjustment time will not hinder throughput.

Process Latitude and Linewidth Control

Gap settings with high accuracy and stability are required to achieve wide process latitude and linewidth control in proximity x-ray lithography below 0.5 μm. In conventional step and repeat exposure of large area fields where a single gap setting must be used for the entire field, the entire mask 10 and wafer fields must meet stringent flatness and parallelism requirements. With the segmented mask approach described here, however, separate gap settings can be used for smaller field segments simplifying mask and wafer flatness requirements and improving gap accuracy and stability and field to field linewidth control.

THROUGHPUT

By taking advantage of these methods, the time for alignment can be kept equal to or less than the time required to scan across the solid segment. Since no other overheads are involved, the total time between exposure segments can be determined by the scan speed alone. Furthermore, the scan time can be reduced by
condensing the x-ray fan in the horizontal direction to match the reduced exposure field, more closely, thus increasing the flux density.
increasing the flux at the resist by means of the thinner mask 10 and thinner window 30 made possible by scanning and by using small mask segments.

OVERHEAD PER FIELD

A mirror is often used in the beamline to transfer and reshape the x-ray beam onto the mask 10, where throughput needs to be maximized, runout is to be avoided, and the like. For wide, horizontal fields, the beam cannot be kept entirely in the horizontal plane. The beam becomes extended in the vertical direction at the edges of the field necessitating considerable overscan to expose the entire field properly. When smaller fields are employed, the vertical extension of the beam is reduced allowing more efficient use of the scan for exposure only. By using the segmented mask scanner of this invention, the overscan overhead per field can thus be eliminated.

FULL WAFER COVERAGE

The number of fields covered by each scan is determined by the size of the mask 10 and the size of the membrane segment 16. In the ideal case the mask 10 would be as large as the wafer 11 (e.g. 200 mm) so that the full wafer diameter could be covered in a single scan. As a result of segmenting the mask 10 (FIG. 3), not all the area of the mask 10 is exposed in a single scan. In the typical case where the segments 16 are spaced at twice their vertical dimension, the mask 10 must be shifted with respect to the wafer 11 by an amount equal to the segment height, and a second scan is needed to cover the full region at that particular wafer position. Thus, exposure of the full area of the mask 10 at a fixed horizontal wafer location involves;

1. two vertical scans whose length is equal to the full vertical dimension of the patterned mask 10 area.
2. A single vertical step of the wafer 11 with respect to the mask 10.

To cover the entire wafer, the wafer 11 is stepped horizontally, by a distance equal to the horizontal dimension of the exposure segment 16, and the vertical scan process is repeated.

By eliminating stepping between exposure segments, and doing much of the alignment acquisition and gap 32 adjustment in parallel to the exposure, the overhead times for covering an entire wafer 11 are significantly reduced.

In this way, a large number of relatively small exposure fields can be exposed over the entire wafer 11 with a throughput determined primarily by
the exposure time,
a small number vertical and horizontal steps, and
the load/unload and initial wafer 11 alignment times;
with stepping and alignment overhead times at each field virtually eliminated.

THROUGHPUT ANALYSIS

There is a throughput advantage with the segmented mask 10 for situations where only small or medium sized fields can be used, due to the difficulty in fabricating masks which can achieve tight mask-to-mask overlay over large fields. Next we compare the segmented mask 10 scanning method to the more conventional step-and-repeat system. In such systems, a single mask field is aligned, exposed by scanning the beam across the field with a mirror, and stepped from site to site across the wafer. For comparison assume typical high speed parameters for the two systems for the case of a 10×20 mm field and a 200 mm wafer.

MIRROR SCAN/ STOP AND REPEAT ALIGNER

The key parameters determining throughput are:
Toh—wafer overhead time (load, unload, first field align)
Te—exposure time
Ts—Step time
Ta—Align time
Tohf—Overhead time per field
Nf—Number of Mask Fields exposed
Tw—Time per wafer
Wh—Wafers per hour Nf depends on the field size. Approximate values for Nf for different field sizes are given in Table I.

For the mirror scanner, $$Tw = Toh + Nf(Te + Ts + Ta + Tohf) \quad \text{Eq. (1.)}$$

since there is a step, align, and exposure at each site.

Using system parameters based on a compact storage ring type of synchrotron 18 and an efficient beamline 19 which give 100 mW/cm² absorbed in 1um of resist having a sensitivity of 100mJ/cm² and the exposure system parameters as follows:

$Ts + Ta = 1$ sec.

$Toh = 0.5$ sec.

$Toh = 15$ sec.

we obtain values for Tw and the throughput Wh in wafers per hour which are given in Table I for various field sizes. As expected, throughput increases directly with field size.

SEGMENTED MASK SCANNER

The segmented mask scanner employed here is specifically designed so that many of the operations can be done in parallel during exposure and scan. Therefore, it behaves differently from the step-and-repeat system with regard to throughput. In the segmented mask scanner, wafers 11 are loaded and aligned at the top of the scan (Toh). The mask 10 and wafer 11 pair are then scanned across the narrow beam (Te). The alignment for each field occurs during exposure of the previous site (or during the "dead time" between field segments). At the end of a full scan (which covers the full length of the mask), the wafer 11 is shifted vertically by one period with respect to the mask 10, and a second scan takes place. This scan-shift-scan sequence is then repeated for each scan field.

Based on this description, total time per wafer 11 for the segmented mask scanner is given by $$Tw = Toh + (2 \times Nmf) \times (Te + Trs) \quad \text{Eq. (2.)}$$

where Nmf is the number of mask fields which can cover the full 200 mm wafer 11, Trs is the time to retrace the scanner and shift the wafer 11, Te is the exposure time determined by $$Te = Ds/Rs \quad \text{Eq. (3.)}$$

where
Ds is the scan distance and
Rs is the scan rate

Note: Step and align time and overhead time per field do not contribute to wafer throughput due to the unique design of the segmented mask scanning system.

The number Nmf of mask fields which can cover the full 200 mm wafer 11 depends on the mask field size. In the following analysis mask diameters of 125 and 200 mm are assumed and Nmf is determined for each.

FLUX AND SCAN RATE FOR SEGMENTED MASK SCANNER

To determine the intensity at the wafer 11 for the segmented mask scanner system, assume the same source and resist parameters used for the step-and-repeat system analyzed above, and allow for a factor of two increased transmission through the window 30 and mirror resulting from the thinner membranes made possible by using smaller mask fields. The flux and resist sensitivity used is assumed to expose a 20 mm vertical field in 1 sec when a 20 mm high beamline window 30 and 20 mm high mask 10 are used. With the factor of two flux increase the scanner will operate at 40 mm/sec under the same exposure conditions, so that Rs=40 mm/sec.

RETRACE AND STEP TIME

We assume that any retrace can take place at the scan speed of 40 mm/sec with 1 sec. for any acceleration and deceleration and that stepping or shifting the wafer 11 to the next scan position takes place in parallel to the retrace. Thus $$Trs = (90/40) + 1 = 3.25 \text{ sec. for 125 mm mask}$$

and $$Trs = (180/40) + 1 = 5.5 \text{ sec. for 200 mm mask.}$$

Furthermore, it is possible to eliminate the need for retracing by building the scanner to scan in both directions. With such a "bi-directional scanner", the only overhead is the time needed to reverse the scan direction which we assume to be 1 sec, so that Trs= 1 sec. for a bi-directional scanner.

TABLE I

| | THROUGHPUT ANALYSIS - Step and Repeat - Mirror Scanning | | |
|---|---|---|---|
| # Chips per Field | Exposure Field on Mask | Nf | Wh Waf/Hr. |
| 1 | 10 × 20 mm | 133 | 10 |
| 2 | 20 × 20 mm | 67 | 21 |
| 3 | 30 × 20 mm | 44 | 32 |
| 4 | 40 × 20 mm | 33 | 43 |
| 5 | 50 × 20 mm | 27 | 54 |

TABLE II

| THROUGHPUT ANALYSIS - Segmented Mask | | |
|---|---|---|
| OVERHEAD per wafer (sec) | Toh | 15 |
| SCAN DISTANCE (mm) | Ds | 90, 180 |
| TRANSMISSION IMPROVEMENT | | 2X |
| RESIST SENSITIVITY (mJ/cm²) | Q | 100 |
| FLUX (mW/cm² in 20 × 50 area) | I | 100 |
| SCAN RATE (mm/sec) | Rs | 40 |
| RETRACE TIME (sec) | Tr | 3.25/2.0/1.0 |
| NUMBER OF MASK FIELDS/WAFER | Nmf | 3 to 14 |
| MASK DIAMETER (mm) | Dm | 125/200 |
| 125 mm MASK | | |
| Rs | | 40 mm/sec. |
| Ds | | 90 mm |
| Field (mm) | 10 × 20 | 10 × 40 |

TABLE II-continued

| Nmf | 14 | 8 |
|---|---|---|
| Tr (sec.) | Wafers per hour | |
| 3.25 | 21.3 | 35 |
| 1.0 | 34.0 | 53.7 |

| 200 mm MASK | | | |
|---|---|---|---|
| Rs | 40 mm/sec. | | |
| Ds (mm) | 180 | 180 | 180/120 |
| Field (mm) | 10 × 20 | 10 × 60 | 10 × 40 |
| Nmf | 9 | 3 | 3/2 |
| Tr (sec.) | Wafers per hour | | |
| 2.0 | 27.2 | 66.6 | 48.6 |

Table II summarizes the system parameters and resultant throughputs for the segmented mask approach. Comparing the throughput results in the two Tables shows that a segmented mask with two chips per field (10 by 40 mm segments) can give the same throughput (54 W/Hr.) as the conventional step-and-repeat approach with a mask exposure field 2.5 times larger (20 mm by 50 mm)

As emphasized above, it is significantly more difficult to build x-ray masks and still maintain the required pattern placement accuracy, low defect levels and flatness as the field size increases. By using the methods of this invention, it is possible to achieve the throughput advantages of large exposure fields with the reduced fabrication difficulty associated with the significantly smaller fields possible by segmenting the mask.

What is claimed is:

1. An x-ray lithography mask comprising
   a) a mask substrate,
   b) a set of sequential mask segments each having alignment marks,
   c) said segments being on said mask substrate,
   d) said mask segments being arranged serially on said mask substrate,
whereby said mask with said segments adapted for serial exposure is provided.

2. A lithographic x-ray mask design comprising
   a) a composite membrane formed of a plurality of smaller membrane sequential segments fabricated on a single mask substrate forming a composite mask,
   b) said segments being arranged in serial sequence whereby said segments can be sequentially exposed with an x-ray beam.

3. In a system for alignment and sequential exposure with a beam of radiation of a series of areas on a work piece comprising a wafer from a single sequential mask, said mask having a plurality of separate sequential mask segments therein, the improvement comprising means for scanning said entire wafer horizontally providing exposure to said beam of radiation by repeating two interleaved vertical scans by said beam, said scans having a length equal to the full length of the vertical dimension of the pattered mask area, said scans being made, as follows:
   a) providing a vertical scan of said sequential mask and said wafer indexing from position to position with segments of said mask separated by one index position leaving blank spaces between said index positions,
   b) shifting said wafer relative to said mask by one index position vertically and repeating the vertical scan process with a shift of one index position to fill in the blank spaces left in space (a), and
   c) stepping said wafer horizontally with respect to said sequential mask by a distance equal to the horizontal dimension of the exposure segment,
   d) the vertical scan process is repeated as in steps a) and b).

4. A system for alignment and sequential exposure with a beam of radiation of a series of areas on a work piece from a single mask having a plurality of separate mask segments therein comprising
   a) means for alignment of a first segment of said mask with respect to said work piece, and scanning the above mask and work piece jointly with respect to said beam when said beam passes beyond the mask segment,
   b) means for collecting information on location of the next segment of the mask and the next site on the wafer while the current site is being exposed so alignment correction information and the next mask segment for the next site on the workpiece is obtained in parallel with exposure of the current site, or in parallel to transmit to next site, and
   c) means for aligning said next segment of said mask and said work piece while the exposed location moves away from under the beam and the next site of mask and workpiece are moving towards the beam for exposure of the wafer at next site by the next segment of the mask.

5. A system in accordance with claim 4 wherein means is provided for monitoring and resetting the gap between said mask and said workpiece during the process of alignment and exposure of said work piece.

6. A method of processing x-ray exposure of a semiconductor wafer comprising
   a)
      1) aligning an x-ray mask (10) having a mask opening, with respect to a wafer (11),
      2) scanning said mask and said wafer as a pair jointly with respect to an x-ray beam (22) without shifting said mask and said wafer relative to each other, and
      3) when said beam (22) passes beyond said mask opening said mask can accelerate to the next segment on said wafer,
   b) collecting information on the location of said mask (10) and said wafer (11) at the next site to be exposed on said wafer while the current site on said wafer is being exposed, so alignment correction information for said next site is obtained in parallel with exposure of said current site, by sensing alignment marks (14) on said mask, located close to said next site on said wafer and mask segments to be exposed, which foretell the approach of a new segment in said mask at any time prior to the exposure thereof,
   c) closing shutter (27), while said mask and said wafer continue to index to said next site,
   d) executing the alignment of said mask (10) and said wafer (11) with respect to each other and sensing of the gap (32) between them while the exposed location moves away from under said x-ray beam (22) and said next site is moving towards said beam (22) for exposure of said next site,
   e) monitoring and resetting said gap (32) between exposures, if required, by means of a sensor (60) between said mask (10) and said wafer (11),
   f) interleaving areas to cover unexposed areas of the vertical scan, g) covering said entire wafer (11) horizontally with two vertical scans whose lengths are each equal to the full length of the vertical dimension of the patterned mask area are made seriatim, as follows:
   1) said wafer (11) being stepped horizontally by a distance equal to the horizontal dimension of the exposure segment, and
   2) the vertical scan process being repeated.

7. A method of processing the x-ray exposure of a semiconductor wafer comprising
   a) employing an x-ray mask (10) containing a multiplicity of thin, small membrane segments (16), fabricated on a single mask substrate (12), having high overlay accuracy and stability and high x-ray and optical transmission compared to single large size thick mask membrane areas,
   b) arranging said multiplex membrane segments (16) on said mask substrate (12) parallel to each other for sequential scanning in a direction perpendicular to the beam fan by or through the narrow x-ray beam, and
   c) employing an align and expose system utilizing said mask in a scanning mode which minimizes system overhead time by taking advantage of said higher transmission and said multiple membrane segments (16).

* * * * *

UNITED STATES PATENT AND TRADEMARK OFFICE
CERTIFICATE OF CORRECTION

PATENT NO. : 5,235,626
DATED : August 10, 1993
INVENTOR(S) : Alexander L. Flamholz, Robert P. Rippstein, Yuli Vladimirsky and Chester A. Wasik It is certified that error appears in the above-indentified patent and that said Letters Patent is hereby corrected as shown below:

ON THE TITLE PAGE: Insert the word "Sequential" in the title.

[54] SEGMENTED MASK AND <u>SEQUENTIAL</u> EXPOSURE SYSTEM FOR X-RAY LITHOGRAPHY

Signed and Sealed this

Thirtieth Day of April, 1996

*Attest:*

BRUCE LEHMAN

*Attesting Officer*  *Commissioner of Patents and Trademarks*